US007019568B2

(12) United States Patent
Olsen

(10) Patent No.: US 7,019,568 B2
(45) Date of Patent: Mar. 28, 2006

(54) CLOCK INDEPENDENT POWER-ON-RESET CIRCUIT

(75) Inventor: Alf Olsen, Oslo (NO)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/408,366

(22) Filed: Apr. 8, 2003

(65) Prior Publication Data

US 2004/0201404 A1    Oct. 14, 2004

(51) Int. Cl.
*H03L 7/00* (2006.01)
(52) U.S. Cl. .......................... 327/143; 327/77
(58) Field of Classification Search ............... 327/143, 327/198, 77
See application file for complete search history.

(56) References Cited

U.S. PATENT DOCUMENTS 5,144,159 A * 9/1992 Frisch et al. ................ 327/198

* cited by examiner

*Primary Examiner*—Quan Tra
(74) *Attorney, Agent, or Firm*—Dickstein Shapiro Morin & Oshinsky LLP

(57) ABSTRACT

A system and method for providing a clock-independent reset signal based on supply voltage threshold levels is described. The trip points or predefined voltage levels where the power-on-reset circuit behavior reverses (which controls the reset signal) is determined by the dimensions of the transistors selected for the voltage dividers. The system and method described allows for a clock-independent stable power-up phase wile consuming a very small area of a circuit board and, in particular, on integrated circuits.

38 Claims, 4 Drawing Sheets

US 7,019,568 B2

CLOCK INDEPENDENT POWER-ON-RESET CIRCUIT

FIELD OF THE INVENTION

The present invention relates generally to power-on-reset circuits and specifically to a clock-independent power-on-reset circuits.

BACKGROUND OF THE INVENTION

Power-on-reset circuits are used to reset circuits in a variety of circuits, subsystems and systems. Such power-on-reset circuits output a reset signal that is dependent upon a clock. There is an increasing need to reset circuits (subsystems or systems) that do not have ready access to a clock signal. In other instances, the power-up phase of a circuit using a power-on-reset circuit may depend on a voltage level. It would be additionally advantageous for the clock-independent power-on-reset circuit to consume a small area on a circuit board and in particular on integrated circuits.

SUMMARY OF THE INVENTION

The present invention provides a clock-independent reset signal based on supply voltage threshold levels and quadratic I–V behavior of MOS transistors. The clock-independent power-on-reset circuit includes a first and a second voltage divider, each connected to the supply voltage, an amplifier coupled to both the first and the second voltage dividers. The amplifier is a high gain amplifier in an open loop configuration and includes a differential stage that has an output coupled to the first of a pair of asymmetrical inverters. The high gain amplifier in open loop mode operates as a comparator. The clock-independent power-on-reset circuit also includes a feedback circuit for feeding back an output of the amplifier to an input of the amplifier.

The present invention operates at low supply voltage levels, is clock-independent and resides in a small area of an integrated circuit or a circuit board.

DETAILED DESCRIPTION OF THE PREFERRED EMBODIMENTS

The present invention will be described in connection with exemplary embodiments illustrated in FIGS. 1–3. Other embodiments may be realized and other changes may be made to the disclosed embodiments without departing from the spirit or scope of the present invention.

The clock-independent power-on-reset circuit of the present invention provides a reset signal based on supply voltage threshold levels and quadratic I–V behavior of MOS transistors. The current through a MOS transistor with the gate and the drain connected together is not linearly dependent on the drain voltage but rather is proportional to the drain voltage squared and thus indicates quadratic I–V behavior.

Before the supply voltage has reached a sufficient level, digital circuits are unstable and end up in an undefined state at the end of the power-up phase. The power-on-reset circuit of the present invention clamps the global reset to logic "low" or very close to zero (ground) voltage while the supply voltage is below a predefined value, and releases the reset when the supply voltage rises above another predefined value. The power-on-reset circuit of the present invention thus maintains a defined state even at very low supply voltages and holds that state for all logic circuit reset inputs as long as the power is low. At the end of the power-up phase, the chip held at reset by the power-on-reset circuit of the present invention starts from the reset state.

Figure 1:
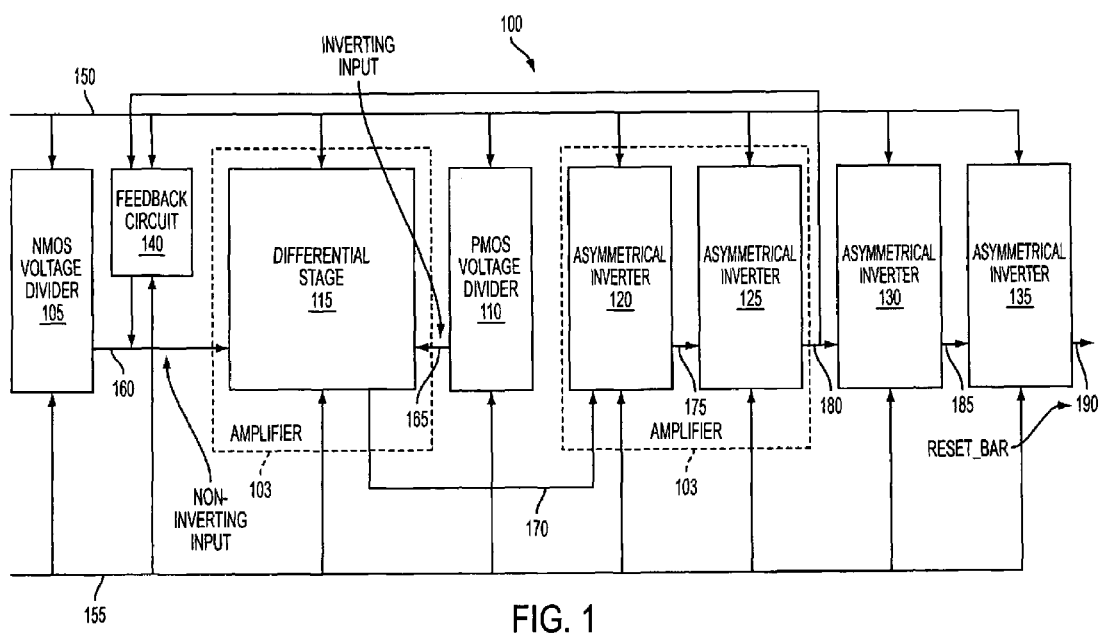
FIG. 1 is a block diagram of the small power-on-reset circuit of an embodiment of the present invention.

FIG. 1 is a block diagram of the power-on-reset circuit of an embodiment of the present invention, which comprises an NMOS voltage divider 105, a PMOS voltage divider 110, a feedback circuit 140, a pair of asymmetrical inverters 130 and 135 and an amplifier 103. The amplifier in open loop mode/configuration includes differential stage 115 and a pair of asymmetrical inverters 120 and 125, where the components that comprise the amplifier are shown enclosed by dashed lines and labeled 103. The amplifier is able to operate at low supply voltage levels. An amplifier with high gain like amplifier 103 operates as a comparator because it only outputs two levels $V_{dd}$ 150 and ground 155. These two levels report the sign of a differential input. The open loop mode amplifier 103 in combination with feedback circuit 140 results in a comparator with hysteresis.

NMOS voltage divider 105 provides a non-inverting input 160 to differential stage 115 of amplifier 103. PMOS voltage divider 110 provides an inverting amplifier input 165 to differential stage 115 of amplifier 103. Both voltage dividers are non-linear.

The output 160 from NMOS voltage divider 105 is compared with the output 165 of PMOS voltage divider 110 by differential stage 115. NMOS voltage divider 105 and PMOS voltage divider 110 have opposite current vs. voltage characteristics. At low supply voltages, the output 160 of NMOS voltage divider 105 follows ground and the output 165 of PMOS voltage divider 110 follows the supply voltage. At high supply voltages, the reverse behavior occurs. The trip point is the voltage at which the behavior reverses and is determined by the ratio of the transistor dimensions used in the voltage dividers. At low supply voltages, the output from the NMOS voltage divider, which is connected to non-inverting input of amplifier 103, rises more slowly with the power supply voltage than the output of the PMOS voltage divider, which is connected to the inverting input of amplifier 103. At high supply voltages, the behavior is reversed. Therefore, the differential input (non-inverting amplifier input minus the inverting amplifier input) changes sign when the supply voltage rises from lower supply voltage levels (close to ground, less than 300 mv) to higher supply voltage levels (close to the nominal supply voltage). This sign change flips the state of the comparator at a predetermined level of the supply voltage. Thus, when the supply voltage is low, the power-on-reset circuit outputs a low RESET_BAR signal 190. When the supply voltage reaches a certain level (high enough for the circuitry being reset to work properly), the RESET_BAR goes high and the reset state is released.

For example, on a 2.5 v-power supply, the RESET_BAR signal 190 is released at 1.6 v (64%) at power up and is activated again when the power drops from nominal value to 1.53 v (61%). In a 3.3 v power supply, the RESET_BAR is released at 2.44 v (74%) at power up and activated again when the power drops from nominal value to 2.33 v (71%).

Output 170 of differential stage 115 is input to asymmetrical inverter 120 (part of open loop mode amplifier 103), which inverts input 170. Output signal 175 of asymmetrical inverter 120 is input to asymmetrical inverter 125 (part of open loop mode amplifier 103), which inverts the signal 175, producing an output signal 180. The asymmetry of inverters 120 and 125 reduces the output signal 180 in order to keep output signal 180 low under low power conditions. Output signal 180 of asymmetrical inverter 125 is input to asymmetrical inverter 130 and to feedback circuit 140. Feedback circuit 140 produces an output signal that is forced into output (circuit node) 160 of voltage divider 105. The impedance of circuit node (output) 160 times the current of the feedback circuit 140 results in the change in voltage level that is sensed by the differential stage. Asymmetrical inverter 130 inverts signal 180 and outputs signal 185, which is input to asymmetrical inverter 135, which inverts signal 185 to produce RESET_BAR signal 190. Each of the asymmetrical inverters not only inverts the input signal but increases the driving capability and sharpens the signal. The inverters are made asymmetrical to increase the noise margins at low supply voltages. Increased noise margin means that the input voltage may be overloaded with a certain noise signal without an undesired change of state.

Viewing the combination of the differential stage 115 and asymmetrical inverters 120 and 125 as an amplifier operating in open loop mode, output 180 of asymmetrical inverter 125 can be considered amplifier output 180. An amplifier in open loop configuration acts as a comparator because there is no negative feedback that controls gain. The output level, therefore, is limited by and follows the power supply voltage for small positive signals (non-inverting input is greater than inverting input) and goes to ground for small negative signals (non-inverting input is less than inverting input). Open loop amplifier 103 is provided with input 160 from NMOS voltage divider 105 and input 165 from PMOS voltage divider 110, which are both supplied with $V_{dd}$ 150 and ground 155. Open loop amplifier 103 compares the two input signals (non-inverting and inverting) from the two voltage dividers. Since only positive feedback is applied to amplifier 103, the open loop effect is enhanced. Amplifier output signal 180 of asymmetrical inverter 125 is input to feedback circuit 140 to add hysteresis to the power-on-reset circuit of the present invention. That is, tie feedback circuit is used to stabilize the comparator (high gain open loop mode amplifier) so that it does not switch back and forth if the two inputs are close to equal and noisy.

As the feedback is regenerative (positive), the output goes to the limiting levels (supply voltage and ground) faster than in true open loop configuration. More importantly, when the output has reached a level different from the balancing "midpoint", it takes more than setting the outputs from the two voltage dividers equally to bring it back to the balancing point. The positive feedback, forces by i.e., the additional current from the feedback circuit 140, the output to stay on the same side of the balancing point. To switch the output to the other level, a greater difference signal is needed than in open loop configuration. In other words, a greater signal is needed to bring the amplifier back to balance than the signal that put the amplifier (comparator) 103 out of balance. The importance of hysteresis is that the amplifier (comparator) 103 can make a stable consistent decision even when the input difference is small and overlaid by noise. Without hysteresis, with small voltage difference from the voltage dividers and noise larger than this difference, the amplifier (comparator) 103 output would change rapidly between the extreme output levels and not settle on one of the extremes and therefore, be unstable.

Figure 2:
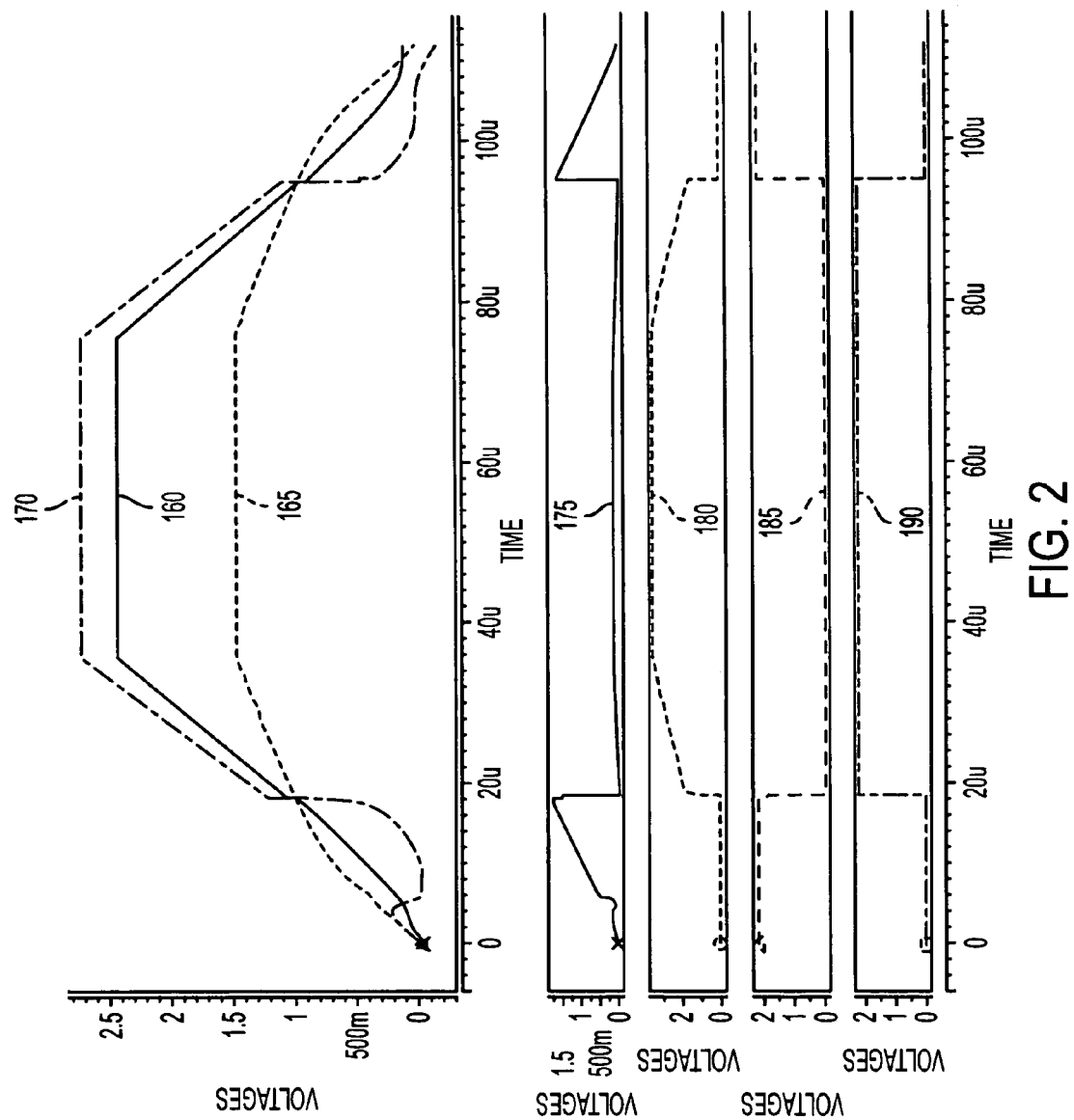
FIG. 2 is a graph of the voltage levels as a function of the supply voltage of an embodiment of the present invention.
Figure 3:
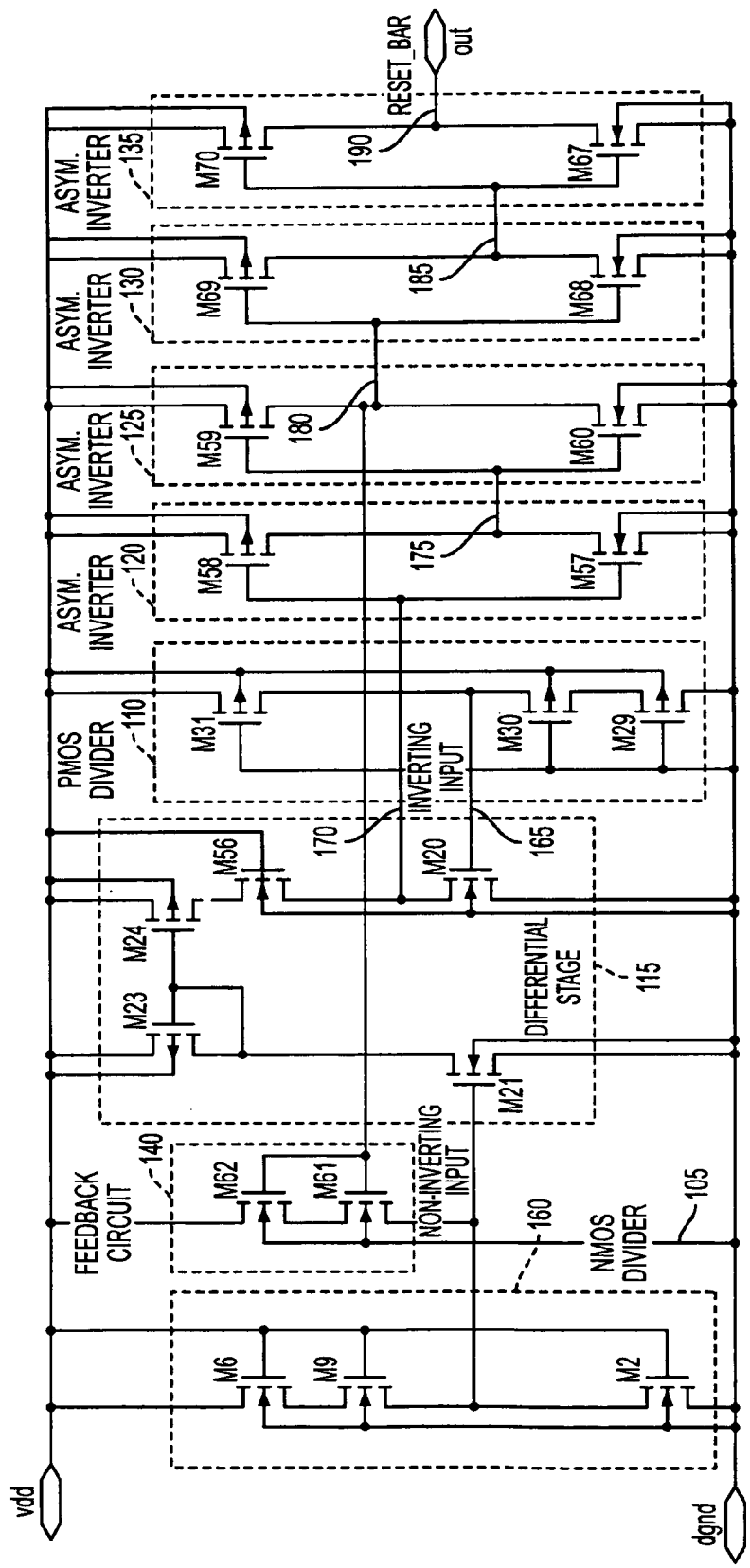
FIG. 3 is a detailed circuit diagram of an exemplary embodiment of the present invention.

FIG. 3 is a detailed circuit diagram of an exemplary embodiment of the present invention and uses the same labeling as FIGS. 1 and 2. The detailed circuit diagram operates as described above.

NMOS voltage divider 105 comprises NMOS transistors M6, M9 and M2. M2 is a low threshold long transistor, for example 10μ. M6 and M9 are high threshold short transistors, for example 0.5μ. PMOS voltage divider 110 comprises PMOS transistors M29, M30 and M31. M31 is a low threshold long transistor, for example 4μ. M29 and M30 are high threshold short transistors, for example 0.35μ. Short high threshold transistors M6 and M9 are in series so operate as a single high threshold transistor due to the body effect. Short transistors M29 and M30 in series similarly operate as a single high threshold transistor due to the body effect.

Differential stage 115 comprises NMOS transistors M20, M21 and M56 and PMOS transistors M23 and M24. M56 is used to force the output of differential stage 115 low at very low supply voltages, thus increasing the noise margin. Asymmetrical inverter 120 comprises PMOS transistor M58 and NMOS transistor M57. Asymmetrical inverter 125 comprises PMOS transistor M59 and NMOS transistor M60. Asymmetrical inverters 120 and 125 together with differential stage 115 form amplifier 103 in open loop mode.

Feedback circuit 140 comprises NMOS transistors M61 and M62.

Asymmetrical inverter 130 comprises PMOS transistor M69 and NMOS transistor M68. Asymmetrical inverter 135 comprises PMOS transistor M70 and NMOS transistor M67.

"vvd" represents the supply voltage 150; "dgnd" represents ground 155; and "out" represents the RESET_BAR signal 190.

The "body" or "bulk" of the transistor is the silicon substrate. Assuming the "bulk" of the MOS transistor is at the same potential as the source, the "gate" to "source" potential controls the current through the transistor. If the "bulk" decreases to a lower potential than source, the current decreases. The "bulk" acts like a backside "gate". The silicon substrate is usually constant because it is the reference, but a decrease in "bulk" relative to the "source" is equivalent to an increase in "source" potential relative to "bulk" (substrate). Thus an increase in "source" potential reduces the current when all other transistor terminals are kept constant. This behavior is the "body" effect.

In a first preferred embodiment, NMOS voltage divider 105 comprises three NMOS transistors, where output 160 is forced close to ground at low supply voltages because the source voltage on two of the NMOS transistors rise and, therefore, have higher threshold voltages than the long transistor due to the body effect and take up nearly all of the potential difference between the supply voltage and ground. The last NMOS transistor has a lower threshold voltage because there is no body effect. The long transistor behaves like a resistor. The two short transistors become more conductive due to the quadratic behavior of the current as they go into strong inversion at higher supply voltages, while a voltage drop across the long transistor increases linearly and takes up relatively more of the voltage difference between supply and ground than at low supply voltages. All gates of the NMOS transistors are connected to the supply voltage with the current of the short NMOS transistors behaving like a quadratic function of the voltage and the current of the long transistor behaving linearly. The long transistor has a linear characteristic because the gate voltage is much higher than the drain-source voltage. The output level 160 of NMOS voltage divider 105 increases thus in a quadratic way with the supply voltage and is the amplifier non-inverting input 160 to differential stage 115.

In a first preferred embodiment, the PMOS voltage divider comprises three PMOS transistors. The low threshold long transistor is closest to the supply voltage and two high threshold short transistors are closest to ground. The current of the PMOS transistors behave similarly to the NMOS transistors. The connections are reversed to that of the NMOS voltage divider and the PMOS voltage divider output, therefore, is opposite that of the NMOS voltage divider output. That is, the PMOS voltage divider output follows the supply voltage and remains higher than the NMOS voltage divider output as long as the supply voltage is low. As the supply voltage increases and the short high threshold PMOS transistors start to conduct the PMOS voltage divider output flattens out and remains lower than the NMOS voltage divider output.

In an alternative preferred embodiment, the NMOS long transistor of the NMOS voltage divider is a resistor. In an alternative preferred embodiment, the PMOS long transistor of the PMOS voltage divider is a resistor.

Differential stage 115 receives inverting input 165 from PMOS voltage divider 110, non-inverting input 160 from NMOS voltage divider 105, supply voltage 150 and ground 155. The outputs of NMOS voltage divider 105 and PMOS voltage divider 110 are compared by differential stage 115 which is a simple amplifier in an open loop configuration that is capable of operating at low supply voltages. Differential stage 115 comprises a plurality of transistors, for example, a pair of PMOS transistors and a pair of NMOS transistors, with the pair of PMOS transistors closest to the supply voltage. Differential stage 115 also includes a third NMOS transistor to help force its output low at very low supply voltages. The NMOS transistor gets an additional voltage drop and brings the output closer to ground. This increases the noise margin.

With a rising supply voltage, the comparator flips from low to high when the two input values (inverting amplifier input 165 and non-inverting amplifier input 160) cross. The crossing is termed the "trip point" and is determined by the ratio of the transistor dimensions, which also determines the hysteresis range.

Feedback circuit 140 is connected between amplifier output 180 and amplifier input (output 160 of NMOS voltage divider). The output of feedback circuit 140 is current controlled by the amplifier output 180 and the two transistors comprising the feedback circuit 140. This current is added to the original current flowing in the lower part of the NMOS voltage divider at the amplifier non-inverting input 160 and pushes the voltage at the amplifier non-inverting input 160 in the same direction as the signal from the voltage divider. In other words, the output of the feedback circuit is added to the output of the NMOS voltage divider.

FIG. 2 is a timing diagram (labeled with the designations used in FIGS. 1 and 3) showing how the internal voltage levels vary as a function of the supply voltage. Non-inverting amplifier input 160 follows ground at low supply voltages and follows the supply voltage at high supply voltages. Inverting amplifier input 165 follows the supply voltage at low supply voltages but flattens out at high supply voltages. Comparator output 170 follows ground (or close to ground) at low supply voltages and reverses at the trip point to follow the supply voltage at high supply voltages. Once the supply voltage falls below a certain level, the comparator output 170 once again reverses to follow ground.

Output 175 of asymmetrical inverter 120 (part of open loop mode amplifier 103) is the inverted and voltage adjusted differential stage output 170. Output 180 of asymmetrical inverter 125 (part of open loop mode amplifier 103) is the inverted and voltage amplified asymmetrical inverter output 175. Output 185 of asymmetrical inverter 130 is the inverted and sharpened output 180 of asymmetrical inverter 125. Output 190 of asymmetrical inverter 135 is the inverted and sharpened output 185 of asymmetrical inverter 130.

The present invention may be used as a part of other circuits, such as an image sensor with an A/D converter. In such an image sensor circuit, the digitized image data are output in serial form. The image sensor circuit additionally contains a current steering circuit for driving Light Emitting Diodes (LEDs) and a digital thermometer. The image sensor circuit may also be integrated with a CPU and RAM, where the RAM may store data and programs for image storage and image processing. The term RAM includes all forms of RAM such as DRAM, SDRAM, PCRAM, MRAM etc.

The small power-on-reset circuit of the present invention is general and can be used in any chips/circuits that need to start at a defined state (reset) when powered up, for example, controllers, processors, and any sequential circuits and state machines that are clocked through various states and need a defined starting point. One such example might be an optical mouse. Such circuits need to receive an asynchronous reset (clock independent) by a global reset signal.

In a larger sense, the small power-on-reset circuit of the present invention can be embedded in computer systems, process control systems, and any sequential systems. The usage of the power-on-reset circuit of the present invention in a discrete system would be equivalent to the usage in chips and other circuits as described above.

Figure 4:
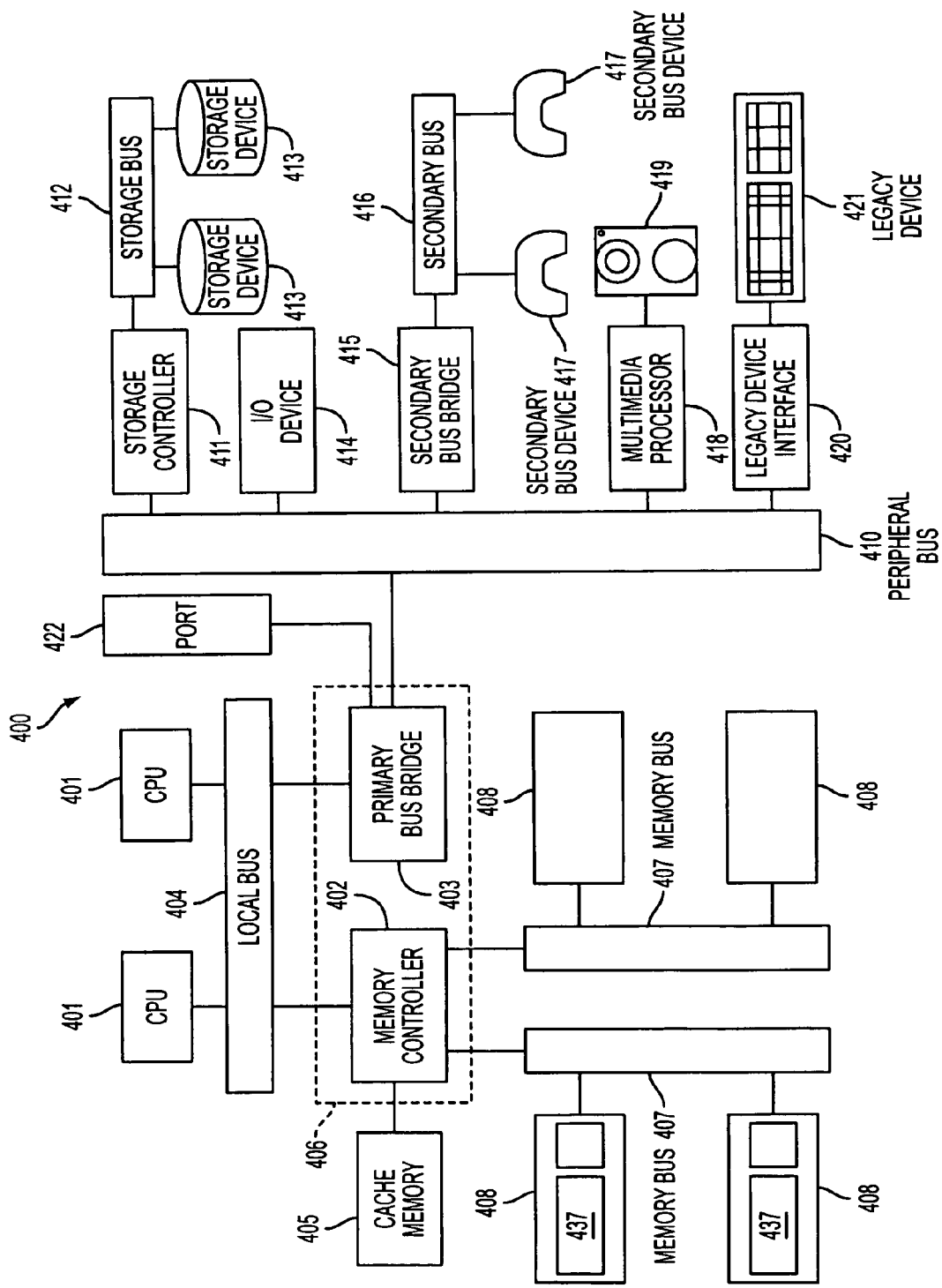
FIG. 4 is a block diagram of an exemplary computer system having an exemplary image processor having an exemplary image sensor using a small power-on-reset circuit of the present invention.

The present invention can be utilized within any integrated circuit which receives an input signal from an external source. FIG. 4 illustrates an exemplary processing system 400 utilizing a small power-on-reset circuit constructed in accordance with the present invention. The small power-on reset circuit of the present invention may be used by any of the various components of processing system 400, specifically any components including integrated circuits (ICs). The processing system 400 includes one or more processors 401 coupled to a local bus 404. A memory controller 402 and a primary bus bridge 403 are also coupled the local bus 404. The processing system 400 may include multiple memory controllers 402 and/or multiple primary bus bridges 403. The memory controller 402 and the primary bus bridge 403 may be integrated as a single device 406.

The memory controller 402 is also coupled to one or more memory buses 407. Each memory bus accepts a memory device 408. The memory device 408 may be integrated with a memory card or a memory module and a CPU. Examples of memory devices include single inline memory modules (SIMMs) and dual inline memory modules (DIMMs). The memory device 408 may include one or more additional devices 409 (not shown). For example, in a SIMM or DIMM, the additional device 409 might be a configuration memory, such as a serial presence detect (SPD) memory. The memory controller 402 may also be coupled to a cache memory 405. The cache memory 405 may be the only cache memory in the processing system. Alternatively, other devices, for example, processors 401 may also include cache memories, which may form a cache hierarchy with cache memory 405. If the processing system 400 include peripherals or controllers which are bus masters or which support direct memory access (DMA), the memory controller 402 may implement a cache coherency protocol. If the memory controller 402 is coupled to a plurality of memory buses 407, each memory bus 407 may be operated in parallel, or different address ranges may be mapped to different memory buses 407.

The primary bus bridge 403 is coupled to at least one peripheral bus 410. Various devices, such as peripherals or additional bus bridges may be coupled to the peripheral bus 410. These devices may include a storage controller 411, an miscellaneous I/O device 414, a secondary bus bridge 415, a multimedia processor 418, and an legacy device interface 420. The primary bus bridge 403 may also coupled to one or more special purpose high speed ports 422. In a personal computer, for example, the special purpose port might be the Accelerated Graphics Port (AGP), used to couple a high performance video card to the processing system 400.

The storage controller 411 couples one or more storage devices 413, via a storage bus 412, to the peripheral bus 410. For example, the storage controller 411 may be a SCSI controller and storage devices 413 may be SCSI discs. The I/O device 414 may be any sort of peripheral. For example, the I/O device 414 may be an local area network interface, such as an Ethernet card. The secondary bus bridge may be used to interface additional devices via another bus to the processing system. For example, the secondary bus bridge may be an universal serial port (USB) controller used to couple USB devices 417 via to the processing system 400. The multimedia processor 418 may be a sound card, a video capture card, or any other type of media interface, which may also be coupled to one additional devices such as speakers 419. The legacy device interface 420 is used to couple legacy devices, for example, older styled keyboards and mice, to the processing system 400.

The processing system 400 illustrated in FIG. 4 is only an exemplary processing system with which the invention may be used. While FIG. 4 illustrates a processing architecture especially suitable for a general purpose computer, such as a personal computer or a workstation, it should be recognized that well known modifications can be made to configure the processing system 400 to become more suitable for use in a variety of applications.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed is:

1. A clock-independent power-on-reset circuit comprising:
   a first voltage divider connected to a supply voltage, wherein said first voltage divider is an NMOS voltage divider;
   a second voltage divider connected to said supply voltage;
   an amplifier coupled to said first and second voltage dividers, wherein an output of said first voltage divider is coupled to a non-inverting input of said amplifier, and wherein said amplifier is a high gain amplifier in an open loop configuration and includes a differential stage having an output coupled to an even plurality of coupled asymmetrical inverters in addition to a coupled pair of asymmetrical inverters of said amplifier, wherein said high gain amplifier in open loop mode operates as a comparator;
   a feedback circuit for feeding back an output of the amplifier to said input of the amplifier, wherein said feedback circuit provides hysteresis to stabilize said high gain open loop mode amplifier; and
   an even plurality of coupled asymmetrical inverters in addition to the coupled pair of asymmetrical inverters of said amplifier.

2. The power-on-reset circuit according to claim 1, where said pair of asymmetrical inverters comprises a first asymmetrical inverter and a second asymmetrical inverter coupled to each other, said first asymmetrical inverter having an input coupled to an output of said differential stage and an output coupled to an input of said second asymmetrical inverter.

3. The power-on-reset circuit according to claim 1, wherein said second voltage divider provides an inverting input to said differential stage.

4. The power-on-reset circuit according to claim 1, wherein said second voltage divider is a PMOS voltage divider.

5. A clock-independent power-on-reset circuit comprising:
   a first voltage divider connected to a supply voltage, said first voltage divider being a NMOS voltage divider;
   a second voltage divider connected to said supply voltage;
   an amplifier coupled to said first and second voltage dividers, wherein said amplifier is a high gain amplifier in an open loop configuration and includes a differential stage having an output coupled to a first one of a coupled pair of asymmetrical inverters, wherein said high gain amplifier in open loop mode operates as a comparator; and
   a feedback circuit for feeding back an output of the amplifier to an input of the amplifier, wherein said NMOS voltage divider further comprises:
   a pair of high threshold short NMOS transistors in series operating as a single high threshold transistor; and
   a low threshold long NMOS transistor.

6. A clock-independent power-on-reset circuit comprising:
   a first voltage divider connected to a supply voltage;
   a second voltage divider connected to said supply voltage, said second voltage divider being a PMOS voltage divider;
   an amplifier coupled to said first and second voltage dividers, wherein said amplifier is a high gain amplifier in an open loop configuration and includes a differential stage having an output coupled to a first one of a coupled pair of asymmetrical inverters, wherein said high gain amplifier in open loop mode operates as a comparator; and
   a feedback circuit for feeding back an output of the amplifier to an input of the amplifier, wherein said PMOS voltage divider further comprises:
   a pair of high threshold short PMOS transistors in series operating as a single high threshold transistor; and
   a low threshold long PMOS transistor.

7. The power-on-reset circuit according to claim 1, wherein said differential stage further comprises a plurality of PMOS transistors and a plurality of NMOS transistors, wherein one of said plurality of NMOS transistors forces the output of said differential stage low at supply voltages close to ground.

8. The power-on-reset circuit according to claim 1, wherein said feedback circuit comprises a pair of NMOS transistors.

9. The power-on-reset circuit according to claim 1, wherein each of said asymmetrical inverters comprises a NMOS transistor and a PMOS transistor and each asymmetrical inverter accepts an input signal, inverts said input signal, amplifies a voltage level of said input signal and sharpens said input signal.

10. A clock-independent power-on-reset circuit comprising:
a first voltage divider connected to a supply voltage, said first voltage divider being a NMOS voltage divider;
a second voltage divider connected to said supply voltage;
an amplifier coupled to said first and second voltage dividers, wherein said amplifier is a high gain amplifier in an open loop configuration and includes a differential stage having an output coupled to a first one of a coupled pair of asymmetrical inverters, wherein said high gain amplifier in open loop mode operates as a comparator; and
a feedback circuit for feeding back an output of the amplifier to an input of the amplifier, wherein said NMOS voltage divider further comprises:
a pair of high threshold short NMOS transistors in series operating as a single high threshold transistor; and
a resistor.

11. The power-on-reset circuit according to claim 10, wherein said resistor functions as a low threshold long NMOS transistor.

12. A clock-independent power-on-reset circuit comprising:
a first voltage divider connected to a supply voltage;
a second voltage divider connected to said supply voltage, said second voltage divider being a PMOS voltage divider;
an amplifier coupled to said first and second voltage dividers, wherein said amplifier is a high gain amplifier in an open loop configuration and includes a differential stage having an output coupled to a first one of a coupled pair of asymmetrical inverters, wherein said high gain amplifier in open loop mode operates as a comparator; and
a feedback circuit for feeding back an output of the amplifier to an input of the amplifier, wherein said PMOS voltage divider further comprises:
a pair of high threshold short PMOS transistors in series operating as a single high threshold transistor; and
a resistor.

13. The power-on-reset circuit according to claim 12, wherein said resistor functions as a low threshold long PMOS transistor.

14. A method of operating a power-on-reset circuit, the method comprising:
applying a first output generated by a first voltage divider to an inverting input of a differential stage of an amplifier while concurrently applying a second output generated by a second voltage divider to a non-inverting input of said differential stage, wherein the second voltage divider is an NMOS voltage divider;
applying a third output generated by said differential stage of said amplifier to a first asymmetrical inverter of a pair of asymmetrical inverters of said amplifier;
feeding back a signal generated by said amplifier to said non-inverting input of said amplifier to provide hysteresis to and to stabilize said amplifier; and
outputting a reset signal generated by a second asymmetrical inverter of said pair of asymmetrical inverters.

15. The method according to claim 14, the method comprising applying an output generated by said pair of asymmetrical inverters to a first one of a coupled pair of asymmetrical inverters.

16. A clock-independent power-on-reset circuit, comprising:
a first voltage divider connected to a supply voltage, wherein the first voltage divider is an NMOS voltage divider;
a second voltage divider connected to said supply voltage;
an open loop mode high gain amplifier having non-inverting and inverting inputs for receiving outputs from said first and second voltage dividers respectively, said open loop mode high gain amplifier further comprises a differential stage, wherein said differential stage is coupled to said first voltage divider and further coupled to said second voltage divider, and a pair of coupled asymmetrical inverters;
a feedback circuit for feeding back an output signal to said non-inverting input of said open loop mode amplifier, wherein said feedback circuit provides hysteresis to stabilize said high gain open loop mode amplifier; and
an even plurality of coupled asymmetrical inverters in addition to the pair of coupled asymmetrical inverters of said amplifier.

17. The power-on-reset circuit according to claim 16, wherein said open loop mode amplifier operates as a comparator.

18. A clock-independent power-on-reset circuit, comprising:
a first voltage divider connected to a supply voltage;
a second voltage divider connected to said supply voltage;
an open loop mode high gain amplifier having non-inverting and inverting inputs for receiving outputs from said first and second voltage dividers respectively; and
a feedback circuit for feeding back an output signal to said non-inverting input of said open loop mode amplifier, wherein said first voltage divider is a NMOS voltage divider, and wherein said NMOS voltage divider further comprises:
a pair of high threshold short NMOS transistors in series operating as a single high threshold transistor; and
a low threshold long NMOS transistor.

19. A clock-independent power-on-reset circuit, comprising:
a first voltage divider connected to a supply voltage;
a second voltage divider connected to said supply voltage;
an open loop mode high gain amplifier having non-inverting and inverting inputs for receiving outputs from said first and second voltage dividers respectively; and
a feedback circuit for feeding back an output signal to said non-inverting input of said open loop mode amplifier, wherein said second voltage divider is PMOS voltage divider,
wherein said PMOS voltage divider further comprises:
a pair of high threshold short PMOS transistors in series operating as a single high threshold transistor; and
a low threshold long PMOS transistor.

20. The power-on-reset circuit according to claim 16, wherein said differential stage further comprises a plurality of PMOS transistors and a plurality of NMOS transistors, wherein one of said plurality of NMOS transistors forces the output of said differential stage low at very low supply voltages.

21. The power-on-reset circuit according to claim 16, wherein said feedback circuit comprises a pair of NMOS transistors.

22. The power-on-reset circuit according to claim 16, wherein each of said asymmetrical inverters comprises a NMOS transistor and a PMOS transistor and each asymmetrical inverter accepts an input signal, inverts said input signal, amplifies a voltage level of said input signal and sharpens said input signal.

23. A clock-independent power-on-reset circuit, comprising:
a first voltage divider connected to a supply voltage;
a second voltage divider connected to said supply voltage;
an open loop mode high gain amplifier having non-inverting and inverting inputs for receiving outputs from said first and second voltage dividers respectively; and
a feedback circuit for feeding back an output signal to said non-inverting input of said open loop mode amplifier,
wherein said first voltage divider is a NMOS voltage divider, and wherein said NMOS voltage divider further comprises:
a pair of high threshold short NMOS transistors in series operating as a single high threshold transistor; and
a resistor.

24. The power-on-reset circuit according to claim 23, wherein said resistor functions as a low threshold long NMOS transistor.

25. A clock-independent power-on-reset circuit, comprising:
a first voltage divider connected to a supply voltage;
a second voltage divider connected to said supply voltage;
an open loop mode high gain amplifier having non-inverting and inverting inputs for receiving outputs from said first and second voltage dividers respectively; and
a feedback circuit for feeding back an output signal to said non-inverting input of said open loop mode amplifier,
wherein said second voltage divider is PMOS voltage divider,
wherein said PMOS voltage divider further comprises:
a pair of high threshold short PMOS transistors in series operating as a single high threshold transistor; and
a resistor.

26. The power-on-reset circuit according to claim 25, wherein said resistor functions as a low threshold long PMOS transistor.

27. A processor circuit comprising:
a clock-independent power-on-reset circuit, said clock-independent power-on-reset circuit further comprising:
a first voltage divider connected to a supply voltage, wherein said first voltage divider is an NMOS voltage divider;
a second voltage divider connected to said supply voltage;
an amplifier coupled to said first and second voltage dividers, wherein an output of said first voltage divider is coupled to a non-inverting input of said amplifier, and wherein said amplifier is a high gain amplifier in an open loop configuration and includes a differential stage having an output coupled to a first one of a coupled pair of asymmetrical inverters, wherein said high gain amplifier in open loop mode operates as a comparator;
a feedback circuit for feeding back an output of the amplifier to said input of the amplifier, wherein said feedback circuit provides hysteresis to stabilize said high gain open loop mode amplifier; and
an even plurality of coupled asymmetrical inverters in addition to the coupled pair of asymmetrical inverters of said amplifier.

28. A processor circuit comprising:
a clock independent power-on reset circuit comprising:
a NMOS voltage divider connected to a supply voltage;
a PMOS voltage divider connected to said supply voltage;
an open loop mode high gain amplifier having non-inverting and inverting inputs for receiving outputs from said NMOS and PMOS voltage dividers respectively, said amplifier comprising asymmetrical inverters; and
a feedback circuit for feeding back an output signal to said non-inverting input of said open loop mode amplifier; and
an even plurality of coupled asymmetrical inverters in addition to the coupled pair of asymmetrical inverters of said amplifier.

29. A clock independent power-on-reset circuit comprising:
a first voltage divider coupled to a supply voltage;
a second voltage divider coupled to said supply voltage;
a comparison circuit having:
a non-inverting input for receiving an output voltage from said first voltage divider;
an inverting input for receiving an output voltage from said second voltage divider;
a circuit for comparing the output voltages received at said non-inverting and inverting inputs and providing a status signal representative of which of said output voltages is higher; and
an output circuit for providing a power-on-reset signal in response to said status signal of said comparison circuit,
wherein said first voltage divider is an NMOS voltage divider and wherein said NMOS voltage divider further comprises:
a pair of high threshold short NMOS transistors in series operating as a single high threshold transistor; and
a low threshold long NMOS transistor.

30. The clock independent power-on-reset circuit according to claim 29, further comprising a feedback circuit coupled to said first voltage divider and coupled to an output of said comparison circuit, said feedback circuit further coupled to said supply voltage.

31. A clock independent power-on-reset circuit comprising:
a first voltage divider coupled to a supply voltage;
a second voltage divider coupled to said supply voltage;
a comparison circuit having:
a non-inverting input for receiving an output voltage from said first voltage divider;
an inverting input for receiving an output voltage from said second voltage divider;
a circuit for comparing the output voltages received at said non-inverting and inverting inputs and providing a status signal representative of which of said output voltages is higher; and
an output circuit for providing a power-on-reset signal in response to said status signal of said comparison circuit,
wherein said second voltage divider is a PMOS voltage divider and wherein said PMOS voltage divider further comprises:
a pair of high threshold short PMOS transistors in series operating as a single high threshold transistor; and
a low threshold long PMOS transistor.

32. The clock independent power-on-reset circuit according to claim 29, wherein said comparison circuit further comprises a plurality of PMOS transistors and a plurality of NMOS transistors, wherein one of said plurality of NMOS transistors forces output of said comparison circuit low at supply voltages close to ground.

33. The clock independent power-on-reset circuit according to claim 30, wherein said feedback circuit comprises a pair of NMOS transistors.

34. The clock independent power-on-reset circuit according to claim 29, wherein said output circuit comprises at least one pair of asymmetrical investors, each of said asymmetrical inverters comprises a NMOS transistor and a PMOS transistor and each asymmetrical inverter accepts an input signal, inverts said input signal, amplifies a voltage level of said input signal and sharpens said input signal.

35. A clock independent power-on-reset circuit comprising:
a first voltage divider coupled to a supply voltage;
a second voltage divider coupled to said supply voltage;
a comparison circuit having:
a non-inverting input for receiving an output voltage from said first voltage divider;
an inverting input for receiving an output voltage from said second voltage divider;
a circuit for comparing the output voltages received at said non-inverting and inverting inputs and providing a status signal representative of which of said output voltages is higher; and
an output circuit for providing a power-on-reset signal in response to said status signal of said comparison circuit,
wherein said first voltage divider is an NMOS voltage divider and wherein said NMOS voltage divider further comprises:
a pair of high threshold short NMOS transistors in series operating as a single high threshold transistor; and
a resistor.

36. The clock independent power-on-reset circuit according to claim 35, wherein said resistor functions as a low threshold long NMOS transistor.

37. A clock independent power-on-reset circuit comprising:
a first voltage divider coupled to a supply voltage;
a second voltage divider coupled to said supply voltage;
a comparison circuit having:
a non-inverting input for receiving an output voltage from said first voltage divider;
an inverting input for receiving an output voltage from said second voltage divider;
a circuit for comparing the output voltages received at said non-inverting and inverting inputs and providing a status signal representative of which of said output voltages is higher; and
an output circuit for providing a power-on-reset signal in response to said status signal of said comparison circuit,
wherein said second voltage divider is a PMOS voltage divider and wherein said PMOS voltage divider further comprises:
a pair of high threshold short PMOS transistors in series operating as a single high threshold transistor; and
a resistor.

38. The clock independent power-on-reset circuit according to claim 37, wherein said resistor functions as a low threshold long PMOS transistor.

* * * * *

UNITED STATES PATENT AND TRADEMARK OFFICE
CERTIFICATE OF CORRECTION

PATENT NO.         : 7,019,568 B2                                Page 1 of 1
APPLICATION NO. : 10/408366
DATED              : March 28, 2006
INVENTOR(S)        : Alf Olsen It is certified that error appears in the above-identified patent and that said Letters Patent is hereby corrected as shown below:

In the Specification, the following errors are corrected:

Column 1, line 7, "to a" should read --to--;

Column 3, line 47, "tie" should read --the--;

Column 6, ine 66, "include" should read --includes--;

Column 7, lines 10-11, "an miscellaneous" should read --a miscellaneous--;

Column 7, line 12, " an legacy" should read --a legacy--;

Column 7, line 13, "also coupled" should read --also be coupled--;

Column 7, line 23, "an local" should read --a local--;

Column 7, line 27, "an universal" should read --a universal--;

Column 7, line 28, "via to the" should read --via the--; and

Column 7, line 31, "to one additional" should read --to additional--.

Signed and Sealed this

Sixth Day of February, 2007

JON W. DUDAS
*Director of the United States Patent and Trademark Office*